United States Patent [19]

Nishimura

[11] Patent Number: 5,043,731
[45] Date of Patent: Aug. 27, 1991

[54] DIGITAL-TO-ANALOG CONVERTER HAVING A LADDER TYPE RESISTOR NETWORK

[75] Inventor: Hirokazu Nishimura, Yamagata, Japan

[73] Assignees: Fujitsu Limited; Fujitsu VLSI Limited, both of Japan

[21] Appl. No.: 567,216

[22] Filed: Aug. 14, 1990

[30] Foreign Application Priority Data

Aug. 19, 1989 [JP] Japan .................................. 1-213759

[51] Int. Cl.$^5$ .............................................. H03M 1/78
[52] U.S. Cl. ...................................... 341/154; 341/118
[58] Field of Search ............................... 341/118, 154

[56] References Cited

U.S. PATENT DOCUMENTS

| | | | |
|---|---|---|---|
| 3,810,158 | 5/1974 | Murakami et al. ................ | 341/154 |
| 4,005,406 | 1/1977 | Kaneko et al. ..................... | 341/118 |
| 4,713,649 | 12/1987 | Hino ................................. | 341/154 |

FOREIGN PATENT DOCUMENTS 56-168428 12/1981 Japan .

Primary Examiner—A. D. Pellinen
Assistant Examiner—Marc S. Hoff
Attorney, Agent, or Firm—Armstrong, Nikaido, Marmelstein, Kubovcik & Murray

[57] ABSTRACT

A digital-to-analog converter includes a ladder type resistor network having stages equal in number to bits of a digital input signal, each of the stages including a first resistor and a second resistor mutually connected in series via a node. A first switch, which is provided for each of the stages, selectively supplies either an upper limit voltage or a lower limit voltage to a corresponding one of the stages in accordance with a logical value of a corresponding one of the bits of the digital input signal. An analog signal output terminal is coupled to the node of one of the stages which corresponds to a most significant bit of the digital input signal. An analog output signal is output via the analog signal output terminal. An offset level control resistor has a first end connected to the node of one of the stages which corresponds to a least significant bit of the digital input signal and a second end. A second switch, which is coupled to the second end of the offset level control resistor, selectively supplies either the upper limit voltage or the lower limit voltage to the second end of the offset level control resistor.

13 Claims, 7 Drawing Sheets

5,043,731

DIGITAL-TO-ANALOG CONVERTER HAVING A LADDER TYPE RESISTOR NETWORK

BACKGROUND OF THE INVENTION

The present invention generally relates to a digital-to-analog converter, and more particularly to a digital-to-analog converter having a ladder type resistor network.

The length of digital data to be processed by a digital-to-analog converter has tended to increase recently. Thus, it is necessary to more precisely determine an analog output level having an increased digital data length.

Referring to FIG. 1, there is illustrated a conventional digital-to-analog (hereinafter simply referred to as D/A) converter having a ladder type resistor network. The D/A converter shown in FIG. 1 is a so-called R-2R ladder type converter. The D/A converter in FIG. 1 has a ladder resistor network 1, which is composed of eight stages corresponding to the number of bits of an digital input signal (eight bits in the illustrated case). The ladder resistor network 1 is composed of resistors 2, each having a resistance value R, and weighting resistors $3a$–$3h$, each having a resistance value 2R. The difference between an upper limit voltage $AV_{DD}$ and a lower limit voltage $AV_{SS}$ is shared among the weighting resistors $3a$–$3h$ so that the weighting resistors $3a$–$3h$ support $\frac{1}{2}^8, \frac{1}{2}^7, \ldots, \frac{1}{2}^1$ of the above voltage difference, respectively. Switching circuits 4–11, each having a MOS transistor structure (CMOS inverter), are connected to the weighting resistors $3a$–$3h$, respectively. The digital input signal is composed of eight bits, $d_0$–$d_7$, which are respectively input to the switching circuits 4–11. The values of the bits $d_0$–$d_7$ determine whether the corresponding weighting resistors $3a$–$3h$ should be connected to a power supply line of the upper limit voltage $AV_{DD}$ or a power supply line of the lower limit voltage $V_{SS}$. Each of the switches 4–11 is connected to the upper limit voltage line $V_{DD}$ when the corresponding bit of the digital input data is equal to "1", and on the other hand, connected to the lower limit voltage line $V_{SS}$ when the corresponding bit is equal to "0".

An analog signal output terminal 20 is provided at a connection node X in the stage of the ladder type resistor network 1 corresponding to the most significant bit $d_7$ of the digital input signal. A offset level control resistor 21 is connected to a node Y in the stage of the ladder type resistor network 1 corresponding to the least significant bit $d_0$ of the digital input signal. One end of the resistor 21 opposite to the node Y is fixedly set at the upper limit voltage $V_{DD}$.

FIG. 2 is a diagram illustrating a real characteristic of the D/A converter shown in FIG. 1 and a theoretical characteristic thereof. A maximum value of the analog voltage output at the analog signal output terminal 20 is obtained when the digital input signal is equal to #FF (hexadecimal notification), that is, when all the bits $d_7$–$d_0$ are equal to binary ones. On the other hand, a potential greater than the lower limit voltage $AV_{SS}$ by $\Delta V$ ($=(AV_{DD}-AV_{SS})/2^8$) appears at the analog signal output terminal 20 when all the bits $d_7$–$d_0$ are equal to binary zeros.

A case will now be considered in which the output of the switch circuit 11 corresponding to the most significant bit $d_7$ of the digital input signal changes from the lower limit voltage $AV_{SS}$ to the upper limit voltage $AV_{DD}$, that is, the digital input signal changes from "01111111" (#7F in hexadecimal notification) to "10000000" (#80 in the hexadecimal notification). In this case, the increasing voltage $\Delta V$ is decreased to $\Delta Vx$ due to the presence of ON resistances of the MOS transistors of the switching circuits 4–10 as well as differences of the resistance values of the resistors 2 and the weighting resistors $3a$–$3h$. In the worst case, the analog voltage for #80 becomes equal to or less than that for #7F.

Half of the voltage difference between $AV_{DD}$ and $AV_{SS}$ appears across the weighting resistor $3h$ corresponding to the most significant bit $d_7$ of the digital input signal. This voltage appearing across the weighting resistor $3h$ is greater than the voltages appearing across the other weighting resistors $3a$–$3g$. As a result, even if the resistance value of the resistor $3h$ has a very small error, this affects the increasing voltage $\Delta Vx$ greatly.

In order to avoid the above problem, it is necessary to precisely determine the actual resistance ratio of the ladder type resistor network 1. For this purpose, conventionally, the resistors 2 and the weighting resistors $3a$–$3h$ are formed of high-precision resistors. Additionally or alternatively, the MOS transistors of the switching circuits 4–11 are formed of large-size MOS transistors having very small ON resistances.

However, the use of high-precision resistors increases production costs, and the use of large-size MOS transistors decreases integration density and increases the production costs.

SUMMARY OF THE INVENTION

It is a general object of the present invention to provide an improved D/A converter in which the aforementioned disadvantages are eliminated.

A more specific object of the present invention is to provide a low-cost, high-precision D/A converter without using high-precision resistors.

The above objects of the present invention are achieved by a digital-to-analog converter comprising a ladder type resistor network having stages equal in number to bits of a digital input signal, each of the stages including a first resistor and a second resistor mutually connected in series via a node, and first switching means, provided for each of the stages, for selectively supplying either an upper limit voltage or a lower limit voltage to a corresponding one of the stages in accordance with a logical value of a corresponding one of the bits of the digital input signal. The D/A converter also comprises an analog signal output terminal coupled to the node of one of the stages which corresponds to a most significant bit of the digital input signal, an analog output signal being output via the analog signal output terminal, and an offset level control resistor having a first end connected to the node of one of the stages which corresponds to the most significant bit or a least significant bit of the digital input signal and having a second end. Further, the D/A converter comprises second switching means, coupled to the second end of the offset level control resistor, for selectively supplying either the upper limit voltage or the lower limit voltage to the second end of the offset level control resistor.

The aforementioned objects of the present invention are also achieved by a digital-to-analog converter comprising a ladder type resistor network having stages equal in number to bits of a digital input signal, each of the stages including a first resistor and a second resistor mutually connected in series via a node, and switching means, provided for each of the stages, for selectively supplying either an upper limit voltage or a lower limit voltage to a corresponding one of the stages in accordance with a logical value of a corresponding one of the bits of the digital input signal. The D/A converter also comprises an analog signal output terminal coupled to the node of one of the stages which corresponds to a most significant bit of the digital input signal, an analog output signal being output via the analog signal output terminal, and an offset level control resistor having a first end connected to the node of one of the stages which corresponds to a predetermined significant bit of the digital input signal and a second end connected directly to an output terminal of the switching means corresponding to the most significant bit of the digital input signal, a selected one of the upper limit voltage and the lower limit voltage being drawn from the output terminal.

BRIEF DESCRIPTION OF THE DRAWINGS

Other objects, features and advantages of the present invention will become more apparent from the following detailed description when read in conjunction with the accompanying drawings, in which:

FIG. 7 is a diagram illustrating the operation of the D/A converter shown in FIG. 3;

DESCRIPTION OF THE PREFERRED EMBODIMENTS

Figure 3:
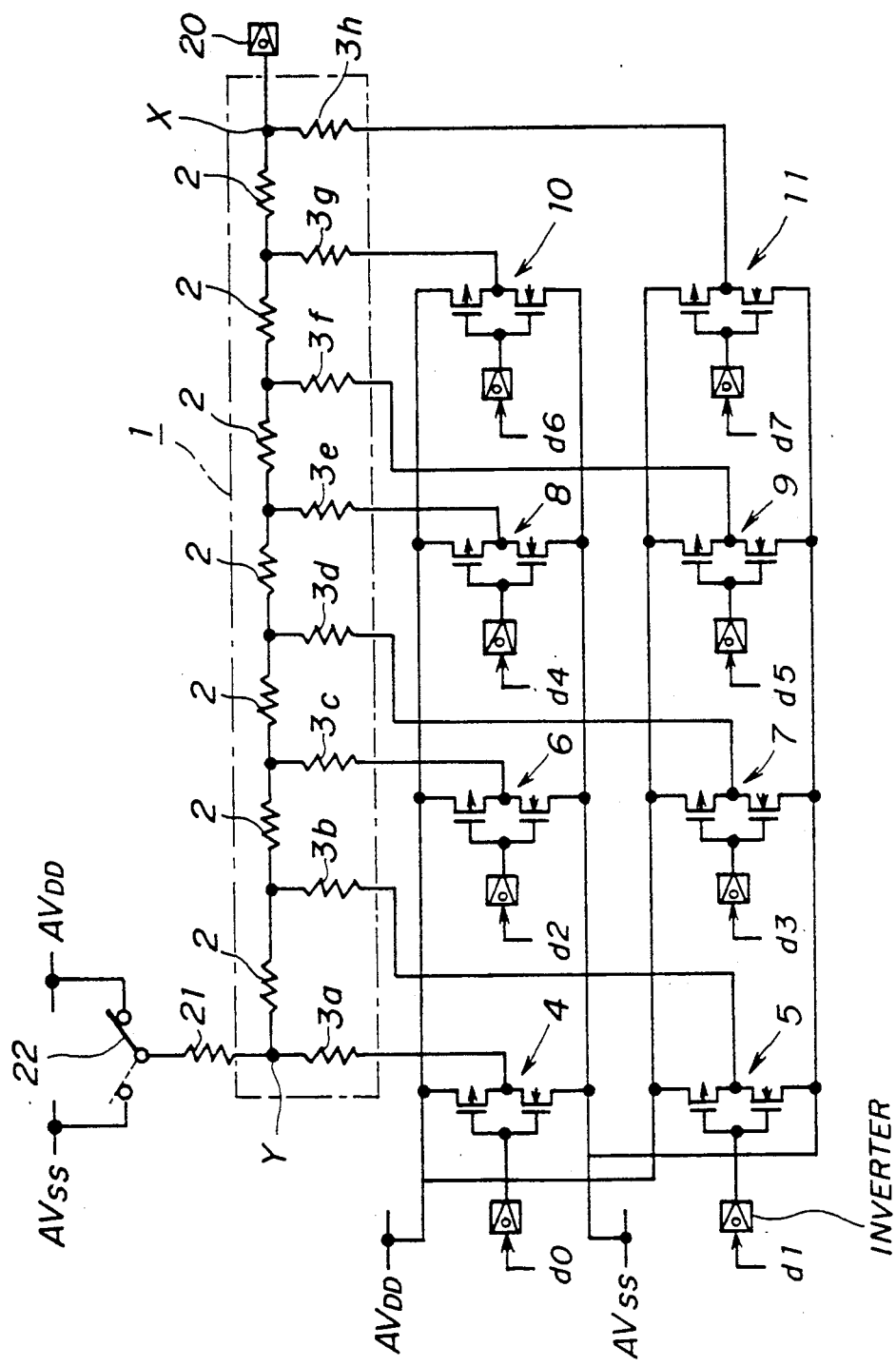
FIG. 3 is a circuit diagram illustrating a general configuration of a D/A converter according to a first preferred embodiment of the present invention.

Referring to FIG. 3, there is illustrated a general configuration of an 8-bit D/A converter according to a first preferred embodiment of the present invention. In FIG. 3, those parts which are the same as those shown in FIG. 1 are given the same reference numerals.

Figure 1:
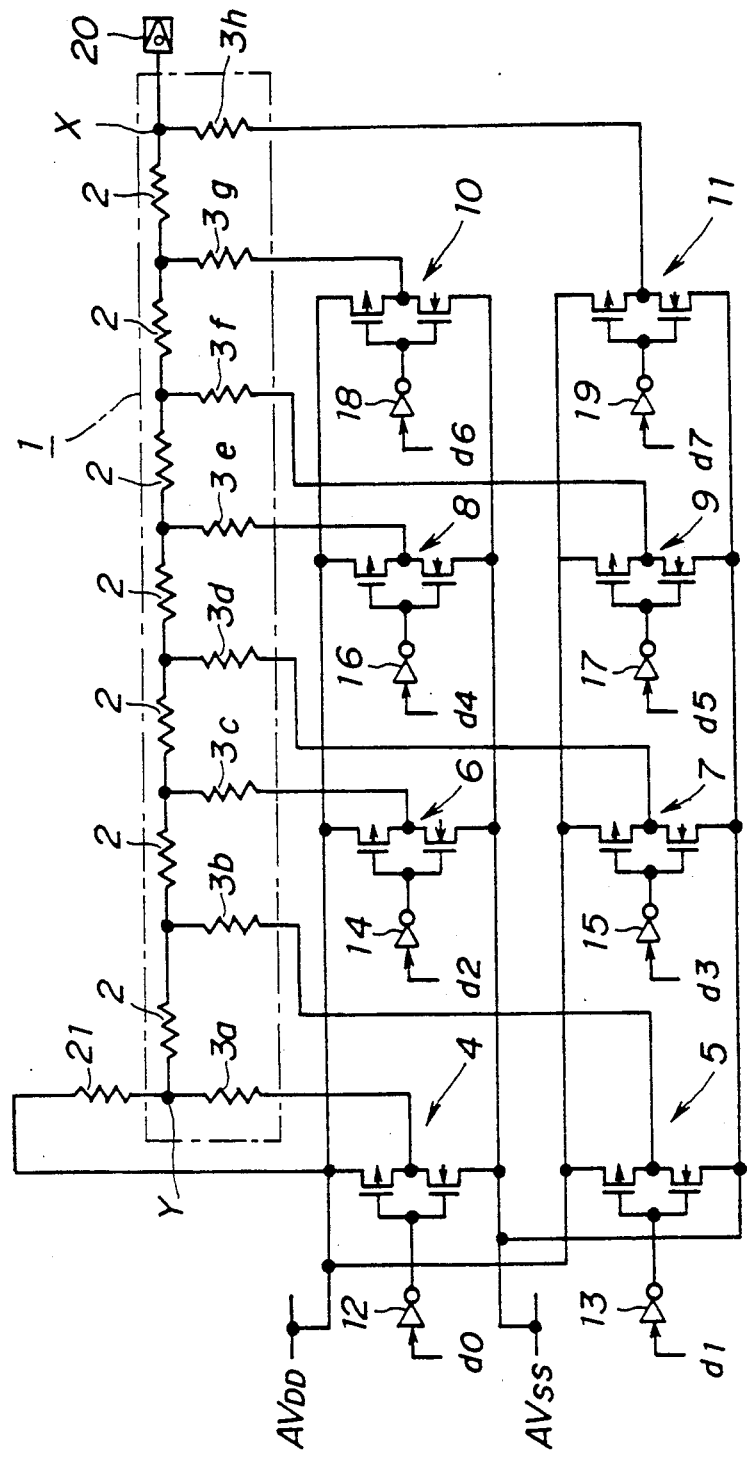
FIG. 1 is a circuit diagram of a conventional D/A converter using a ladder type resistor network.
Figure 2:
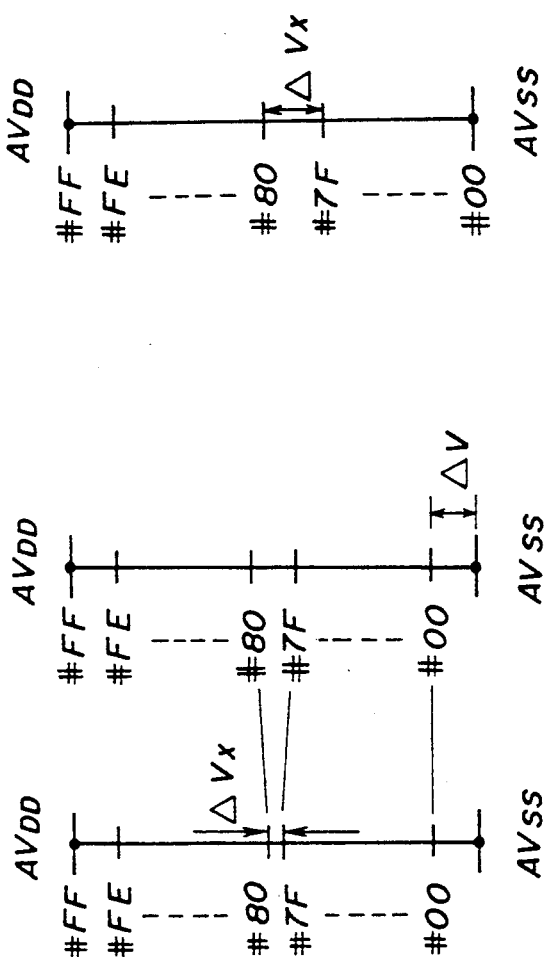
FIG. 2 is a diagram illustrating real and theoretical characteristics of the conventional D/A converter shown in FIG. 1.

The configuration shown in FIG. 3 is different from that shown in FIG. 1 in that the end of the offset level control resistor 21 opposite to the node Y is connected to a moving contact of a switch 22 having a first stationary contact applied to the upper limit voltage $AV_{DD}$ and a second stationary contact applied to the lower limit voltage $AV_{SS}$. The offset level control resistor 21 is provided for the following reason. The voltage between $AV_{DD}$-$AV_{SS}$ is divided by $2^8$ dividing points, ($2^8 + 1$) divided voltages including $V_{DD}$ and $V_{SS}$ are obtained. It will be noted that one divided voltage is unnecessary. Thus, when the highest or lowest analog voltage is output, one divided voltage is added to or subtracted from the highest or lowest voltage by the offset level control resistor 21, so that the analog output voltage is corrected.

While the offset level control resistor 21 is being supplied with the lower limit voltage $AV_{SS}$ through the switch 22, the analog voltage obtained at the analog signal output terminal 20 is decreased by a shifted voltage substantially corresponding to one least significant bit, as compared with that for the conventional D/A converter. On the other hand, while the offset level control resistor 21 is being supplied with the upper limit voltage $AV_{DD}$ through the switch 22, the analog voltage appearing at the analog signal output terminal 20 is the same as that for the aforementioned conventional D/A converter shown in FIG. 1. With this arrangement, the analog voltage at the analog signal output terminal 20 is increased by a voltage substantially equal to twice the voltage corresponding to one least significant bit when the switch 22 is switched from the lower limit voltage $AV_{SS}$ to the upper limit voltage $AV_{DD}$ in synchronism with a change of the most significant bit $d_7$ from #7F to #80.

Figure 4:
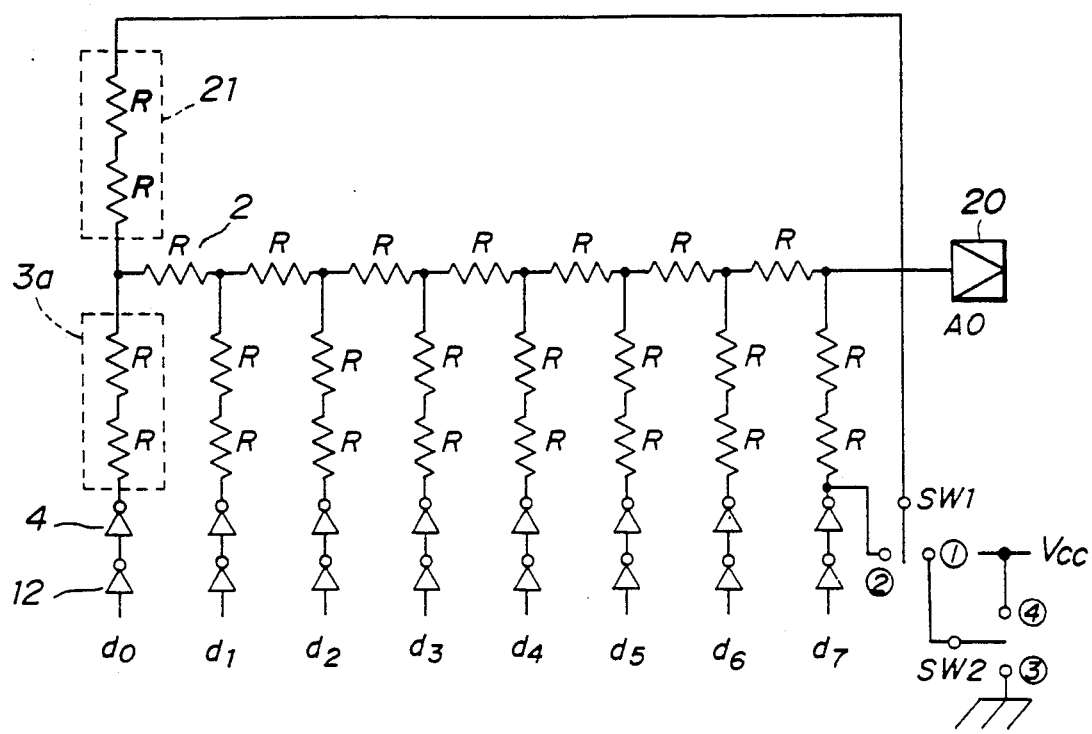
FIG. 4 is an equivalent circuit diagram illustrating the D/A converters shown in FIG. 1 and FIG. 3.

FIG. 4 shows an equivalent circuit which corresponds to the D/A converters shown in FIGS. 1 and 3. Switches SW1 and SW2 are provided, as shown in FIG. 4. The D/A converter shown in FIG. 3 is realized in such a way that the switch SW1 always selects a contact 1 and the switch SW2 selectively selects either a contact 3 (ground) or a contact 4 (Vcc, which is equal to, for example, 5 volts). This arrangement is also realized in such a way that the switch SW1 always selects a contact 2. When the most significant bit $d_7$ is equal to "1", the upper limit voltage $AV_{DD}$ is applied to the offset level control resistor 21. On the other hand, when the most significant bit $d_7$ is "0", the lower limit voltage $AV_{SS}$ is applied to the offset level control resistor 21. The D/A converter shown in FIG. 1 is realized in such a way that the switch SW1 always selects the contact 1 and the switch SW2 always selects the contact 4. With the arrangement shown in FIG. 4, it is possible to realize both the conventional D/A conversion function and the D/A conversion of the present invention.

Figure 5:
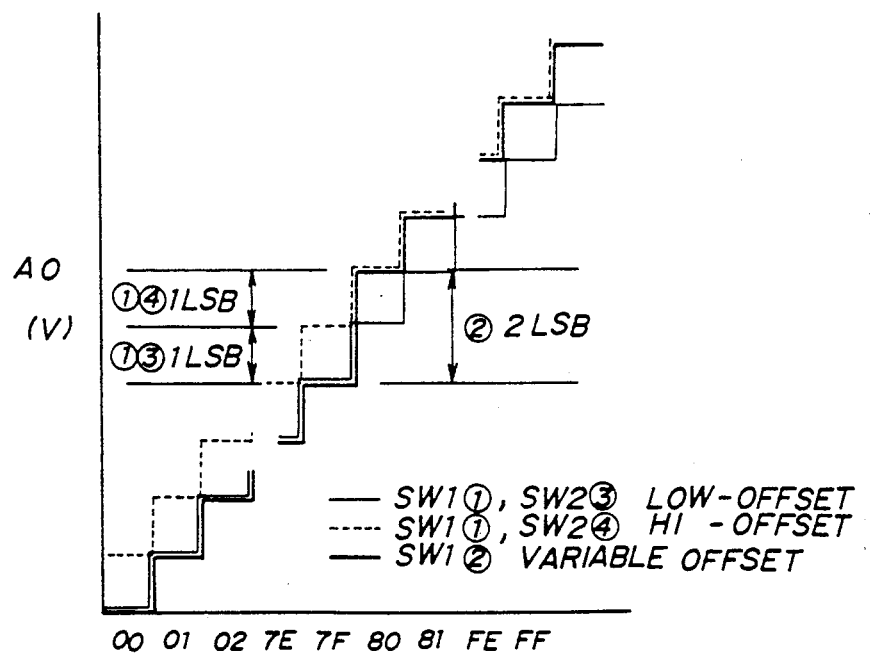
FIG. 5 is a graph illustrating the principle of the present invention.

FIG. 5 is a graph illustrating the relationship between the analog voltage (labeled AO in FIG. 4) at the analog signal output terminal 20 and the digital codes of the digital input signal. The thin solid line in FIG. 5 is related to the case where the switch SW1 selects the contact 2 so that the equivalent circuit in FIG. 5 functions as the D/A converter shown in FIG. 3. The dotted line in FIG. 5 is related to the case where the switch SW1 always selects the contact 1 and the switch SW2 always selects the contact 4 so that the conventional D/A converter shown in FIG. 1 is realized. The thick solid line in FIG. 5 is related to the case where the switch SW1 always selects the contact 1 and the switch SW2 always selects the contact 3.

When the digital input signal is equal to or smaller than #7F, the analog voltage obtained at the analog signal output terminal 20 by the present invention is less than that obtained by the conventional D/A converter by a voltage substantially corresponding to one least significant bit (1LSB). On the other hand, when the digital input signal is equal to or greater than #80, the analog voltage obtained at the analog signal output terminal 20 by the present invention is equal to that obtained by the conventional D/A converter. As a result, according to the present invention, the analog voltage is changed by twice 1LSB (one least significant bit) when the digital input signal changes from #7F to #80.

Figure 6:
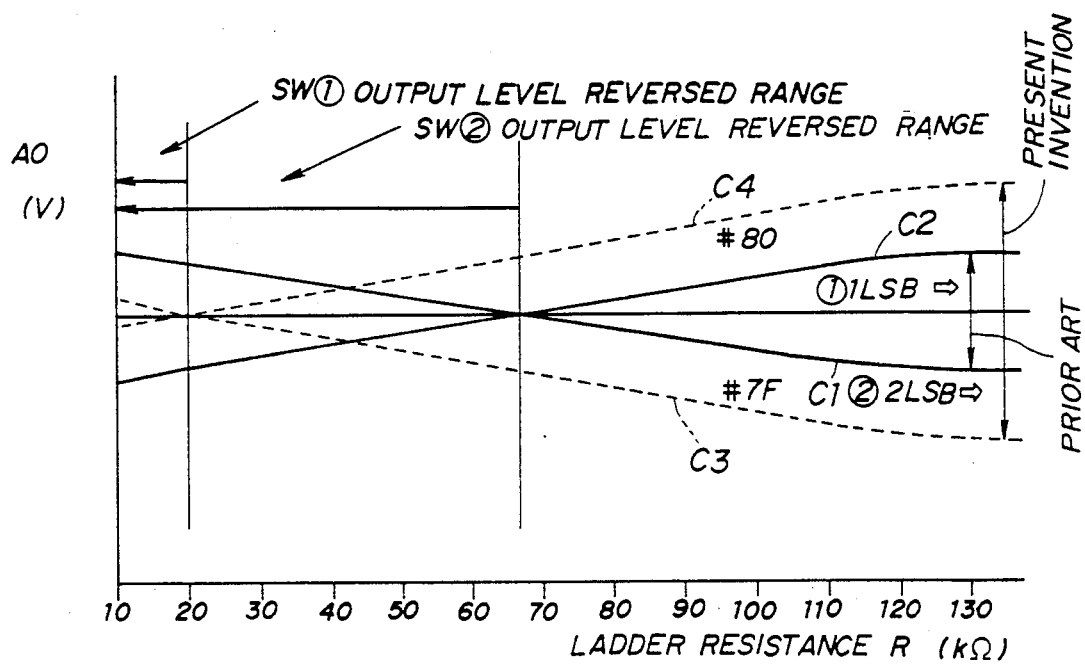
FIG. 6 is a graph illustrating the operational difference between the conventional D/A converter shown in FIG. 1 and that of the present invention shown in FIG. 3.

FIG. 6 is a graph illustrating the relationship between the analog voltage and the resistance (R) of each resistor. Curves C1 and C2 are related respectively to #7F and #80 for the conventional D/A converter. Curves C3 and C4 are related respectively to #7F and #80 for the D/A converter according to the present invention. For the conventional D/A converter, the analog voltage for #80 is less than that for #7F when the resistance value R is equal to or less than about 68 kΩ. On the other hand, according to the present invention, the analog voltage for #80 is less than that for #7F when the resistance value R is equal to or less than about 10 kΩ. As a result, according to the present invention, it is possible to reduce the resistance value R of each resistor in the network 1.

FIG. 7 illustrates the relationship between the ladder resistance and the analog output voltage which is obtained by the present invention and which is shown in FIG. 6. The voltage difference between #80 and #7F is twice the voltage difference $\Delta V$. The lower limit voltage $AV_{SS}$ is obtained when the digital input signal is equal to #00, and the upper voltage $AV_{DD}$ is obtained when the digital input signal is equal to $AV_{DD}$.

Figure 8:
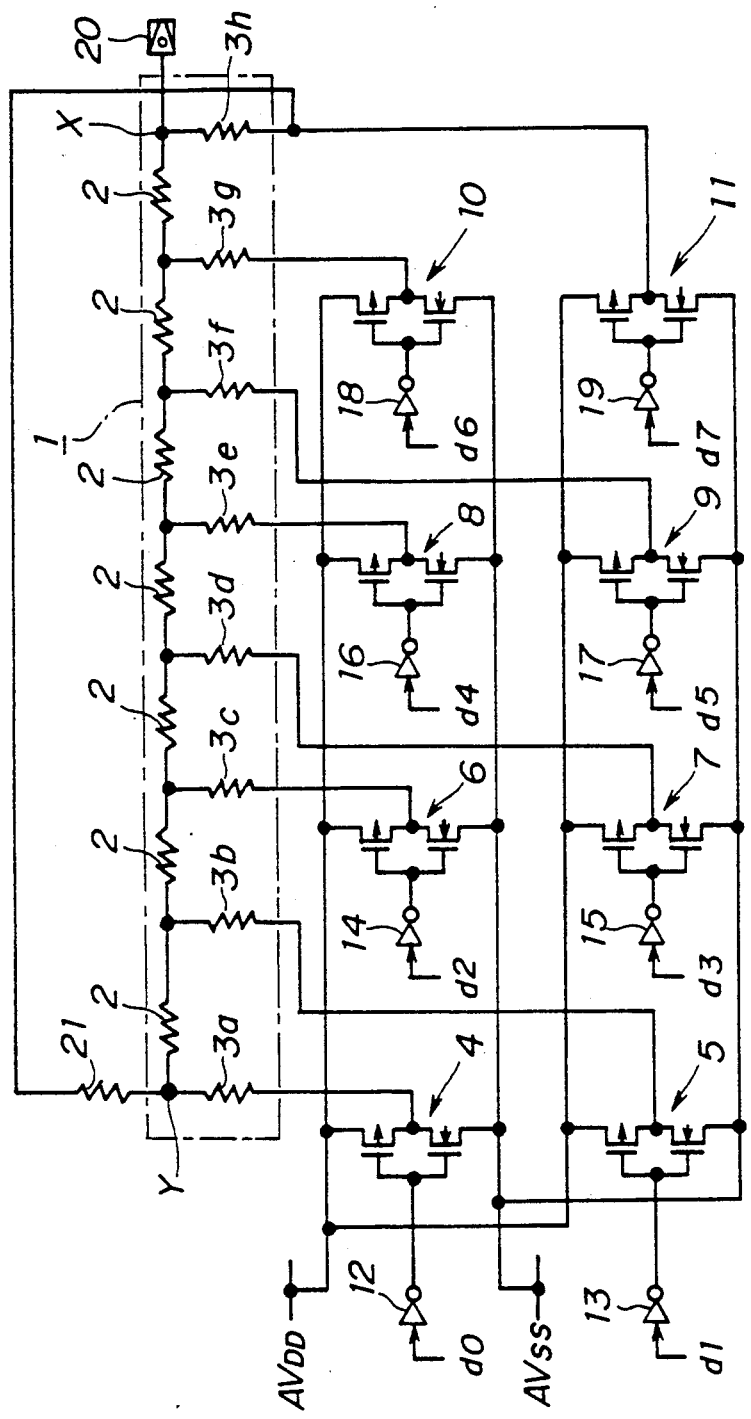
FIG. 8 is a circuit diagram illustrating a more detailed configuration of the D/A converter shown in FIG. 3.

FIG. 8 is a circuit diagram of a more detailed configuration of the D/A converter shown in FIG. 3 or FIG. 4. One end of the offset level control resistor 21 is connected to the node Y of the stage corresponding to the least significant bit $d_0$, and the other end thereof is provided parallel to the weighting resistor $3h$, that is, connected to the output terminal of the switching circuit 11 corresponding to the most significant bit $d_7$. The switching circuit 11 functions as the switch 22 shown in FIG. 3 and it also corresponds to the switch SW1 (FIG. 4) which is fixed to the contact 2.

When the most significant bit $d_7$ of the digital input signal is equal to zero, that is, the bits $d_7$–$d_0$ of the digital input signal are between "00000000" (#00) and "01111111" (#7F), the N-channel MOS transistor of the switching circuit 11 is turned ON so that the lower limit voltage $AV_{SS}$ is applied to the offset level control resistor 21. As a result, an offset of the analog voltage at the analog signal output terminal 20 is equal to zero volt. Thus, when all the bits $d_7$–$d_0$ are equal to zeros (#00), the analog voltage at the analog signal output terminal 20 is equal to the lower limit voltage $AV_{SS}$. That is, a minimum of the available analog voltage is equal to zero volt.

On the other hand, when the most significant bit $d_7$ of the digital input signal is equal to one, that is, the bits $d_7$–$d_0$ are between "10000000" (#80) and "1111111" (#FF), the P-channel MOS transistor of the switching circuit 11 is turned ON, so that the upper limit voltage $AV_{DD}$ is applied to the offset level control resistor 21. As a result, the offset of the analog voltage is equal to $\Delta V$ $(=(AV_{DD}-AV_{SS})/2^8)$. When all the bits $d_7$–$d_0$ are equal to one, the analog voltage becomes equal to the upper limit voltage $AV_{DD}$. As a result, the analog voltage at the analog signal output terminal 20 is increased by $2\Delta V$ (2LSB) when the digital input signal changes from "01111111" to "00000000". As a result, it is possible to prevent the offset $\Delta V_x$ from becoming negative.

It can be seen from the above description that, according to the present invention, it becomes possible to provide the precise analog signal without using high-precision resistors and high-drivability MOS transistors.

Figure 9:
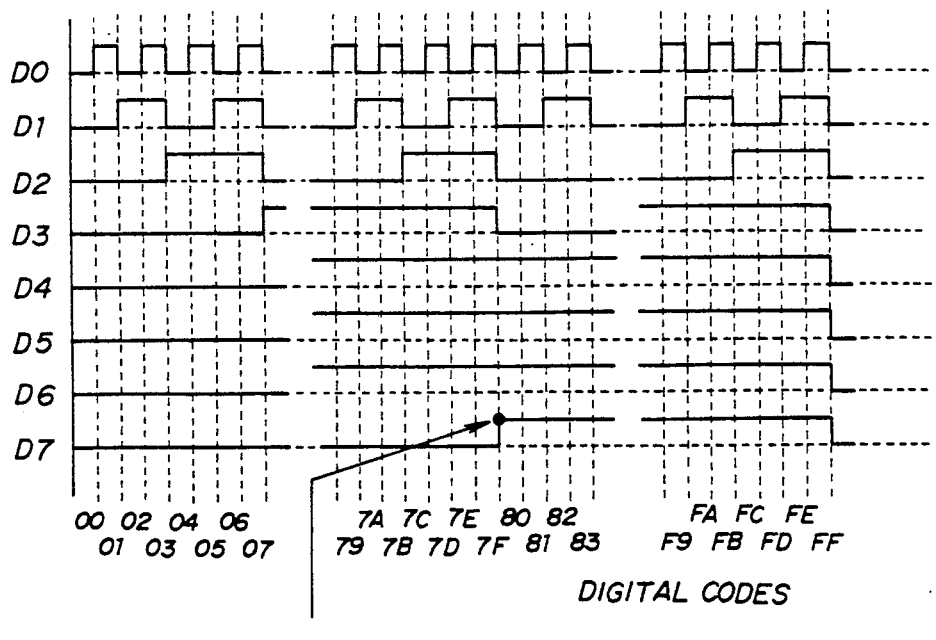
FIG. 9 is a waveform diagram illustrating the operation of the D/A converter shown in FIG. 8.

FIG. 9 is a waveform diagram illustrating the operation of the D/A converter shown in FIG. 8. When the bit $d_7$ of the digital input signal changes from #7F to #80, the upper limit voltage is applied to the offset level control resistor 21 in place of the lower limit voltage $AV_{SS}$.

Figure 10:
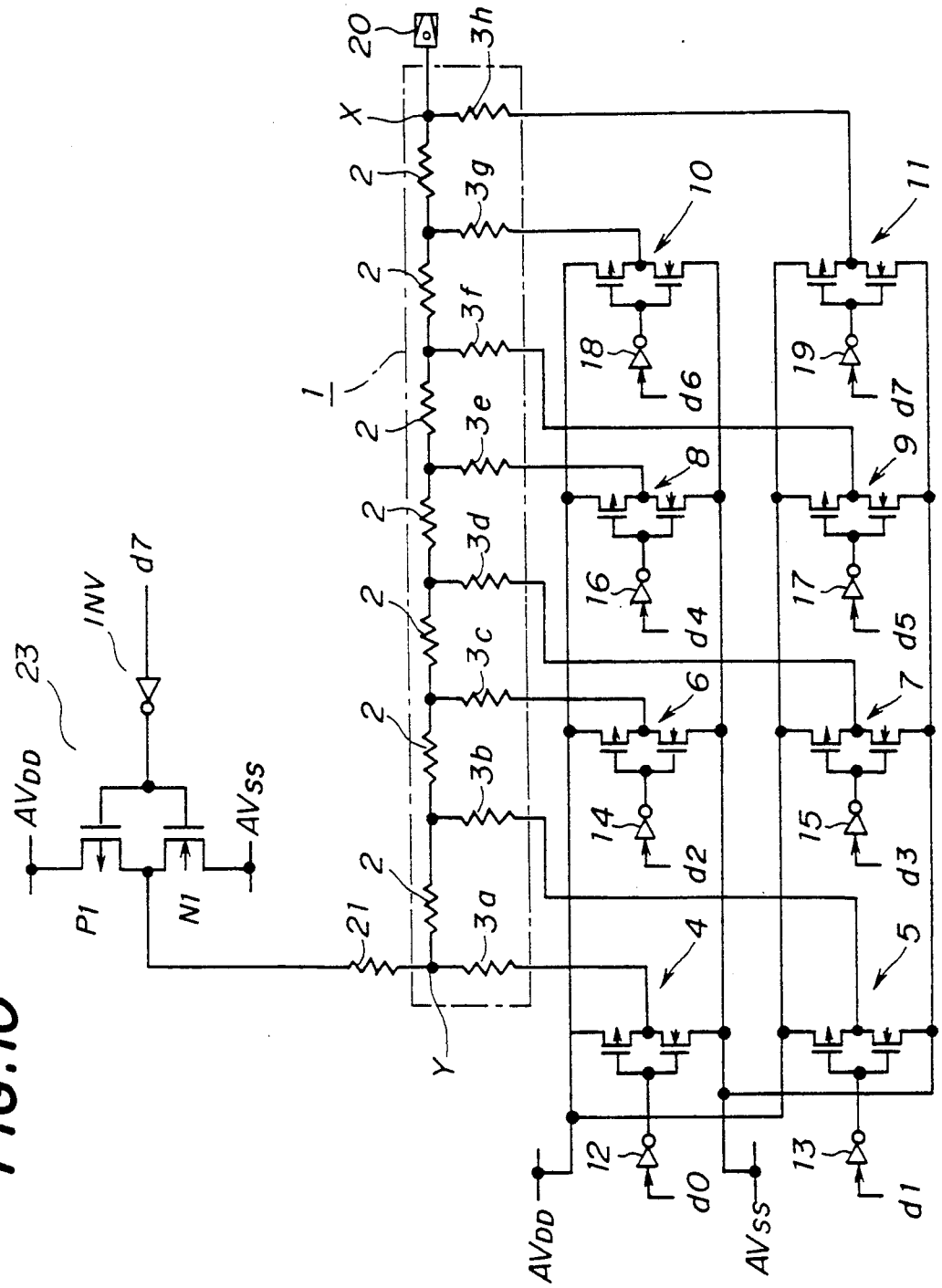
FIG. 10 is a circuit diagram of a D/A converter according to a second preferred embodiment of the present invention.

FIG. 10 is a circuit diagram of a D/A converter according to a second preferred embodiment of the present invention. In FIG. 10, those parts which are the same as those shown in FIG. 8 are given the same reference numerals. The D/A converter in FIG. 10 has a decoder 23 formed of a CMOS inverter. The bit $d_7$ of the digital input signal is applied to the gates of a P-channel MOS transistor P and an N-channel MOS transistor N via an inverter INV. The source of the MOS transistor P is connected to the voltage line $AV_{DD}$ and the source of the MOS transistor N is connected to the voltage line $AV_{SS}$. The drains of the MOS transistors P1 and N1 are connected to the offset level control resistor 21. While the bit $d_7$ of the digital input signal is binary zero, the lower limit voltage $AV_{SS}$ is applied to the offset level control resistor 21. On the other hand, when the digit $d_7$ is binary one, the upper limit voltage $AV_{DD}$ is applied to the offset level control resistor 21.

The above-mentioned embodiments of the present invention are 8-bit D/A converters. However, the present invention is not limited to these D/A converters, and but instead includes D/A converters which process an arbitrary number of bits.

The present invention is suitable for application to an electronic tuner or volume in which the resistance must precisely increase monotonously.

It will be noted that it is possible to connect the offset level control resistor 21 shown in FIG. 3, FIG. 8 or FIG. 10 to the node X in place of the node Y.

The present invention is not limited to the specifically disclosed embodiments, and variations and modifications may be made without departing from the scope of the present invention.

What is claimed is:

1. A digital-to-analog converter comprising:
   a ladder type resistor network having stages equal in number to bits of a digital input signal, each of said stages including a first resistor and a second resistor mutually connected in series via a node;
   first switching means, provided for each of said stages, for selectively supplying either an upper limit voltage or a lower limit voltage to a corresponding one of said stages in accordance with a logical value of a corresponding one of said bits of the digital input signal;
   an analog signal output terminal coupled to the node of one of the stages which corresponds to a most significant bit of said digital input signal, an analog output signal being output via said analog signal output terminal;
   an offset level control resistor having a first end connected to the node of one of the stages which corresponds to a predetermined significant bit of said digital input signal selected from a group consisting of said most significant bit and a least significant bit of said digital input signal and having a second end; and
   second switching means, coupled to the second end of said offset level control resistor, for selectively supplying either said upper limit voltage or said lower limit voltage to the second end of said offset level control resistor.

2. A digital-to-analog converter as claimed in claim 1, wherein said second switching means selectively supplies either said upper limit voltage or said lower limit voltage in accordance with the logical value of said most significant bit of said digital input signal.

3. A digital-to-analog converter as claimed in claim 2, wherein when the most significant bit of said digital input signal is binary zero, said second switching means supplies said lower limit voltage to the second end of said offset level control resistor.

4. A digital-to-analog converter as claimed in claim 2, wherein when the most significant bit of said digital input signal is binary one, said second switching means supplies said upper limit voltage to the second end of said offset level control resistor.

5. A digital-to-analog converter as claimed in claim 2, wherein when the logical value of said most significant bit of said digital input signal changes from binary zero to binary one, said second switching means stops supplying said lower limit voltage to the second end of said offset level control resistor and starts supplying the upper limit voltage to the second end of said offset level control resistor.

6. A digital-to-analog converter as claimed in claim 2, wherein said second switching means comprises decoder means for decoding the most significant bit of said digital input signal and for outputting said logical value of the most significant bit.

7. A digital-to-analog converter as claimed in claim 6, wherein:
  said decoder means comprises a CMOS inverter connected between said upper limit voltage and said lower limit voltage; and
  said CMOS inverter has an input terminal for receiving the most significant bit of said digital input signal through an inverter and an output terminal connected to the second end of said offset level control resistor.

8. A digital-to-analog converter as claimed in claim 1, wherein said second resistor has a resistance twice that of said first resistor.

9. A digital-to-analog converter as claimed in claim 1, wherein:
  said ladder type resistor network comprises eight stages;
  said digital input signal is composed of eight bits; and when said most significant bit of said digital input signal changes from "01111111" to "10000000", said second switching means supplies said upper limit voltage to the second end of said offset level control resistor in place of said lower limit voltage.

10. A digital-to-analog converter as claimed in claim 1, further comprising third switching means for supplying said second switching means with either said upper limit voltage or said lower limit voltage.

11. A digital-to-analog converter comprising:
  a ladder type resistor network having stages equal in number to bits of a digital input signal, each of said stages including a first resistor and a second resistor mutually connected in series via a node;
  switching means, provided for each of said stages, for selectively supplying either an upper limit voltage or a lower limit voltage to a corresponding one of said stages in accordance with a logical value of a corresponding one of said bits of the digital input signal;
  an analog signal output terminal coupled to the node of one of the stages which corresponds to a most significant bit of said digital input signal, an analog output signal being output via said analog signal output terminal; and
  an offset level control resistor having a first end connected to the node of one of the stages which corresponds to a least significant bit of said digital input signal and a second end connected directly to an output terminal of said switching means corresponding to the most significant bit of said digital input signal, a selected one of said upper limit voltage and said lower limit voltage being drawn from said output terminal.

12. A digital-to-analog converter as claimed in claim 11, wherein:
  said switching means corresponding to the most significant bit of said digital input signal comprises a CMOS inverter connected between said upper limit voltage and said lower limit voltage; and
  said CMOS inverter has an input terminal for receiving the most significant bit of said digital input signal and said output terminal connected directly to said offset level control resistor.

13. A digital-to-analog converter as claimed in claim 11, wherein said CMOS inverter receives the most significant bit of said digital input signal through an inverter.

* * * * *